United States Patent [19]

Kaufman

[11] Patent Number: 4,739,449
[45] Date of Patent: Apr. 19, 1988

[54] CIRCUIT PACKAGE WITH THERMAL EXPANSION RELIEF CHIMNEY

[76] Inventor: Lance R. Kaufman, 131 N. White Oak Way, Mequon, Wis. 53092

[21] Appl. No.: 68,653

[22] Filed: Jun. 30, 1987

[51] Int. Cl.[4] .............................................. H05K 7/20
[52] U.S. Cl. .............................. 361/388; 174/52 PE; 357/74; 357/81; 361/395
[58] Field of Search ......................... 165/80.2, 80.3; 174/52 PE, 15 R, 16 R; 357/81, 72, 74; 361/383, 384, 395, 399, 386, 387, 388; 98/58; 363/141

[56] References Cited

U.S. PATENT DOCUMENTS

| | | |
|---|---|---|
| 3,958,075 | 5/1976 | Kaufman . |
| 4,156,148 | 5/1979 | Kaufman . |
| 4,196,411 | 4/1980 | Kaufman . |
| 4,215,235 | 7/1980 | Kaufman . |
| 4,218,724 | 8/1980 | Kaufman . |
| 4,250,481 | 2/1981 | Kaufman . |
| 4,266,140 | 5/1981 | Kaufman . |
| 4,394,530 | 7/1983 | Kaufman . |
| 4,436,951 | 3/1984 | Rief ..................................... 361/388 |
| 4,449,165 | 5/1984 | Kaufman . |
| 4,449,292 | 5/1984 | Kaufman . |
| 4,488,202 | 12/1984 | Kaufman . |
| 4,498,120 | 7/1985 | Kaufman . |
| 4,514,587 | 4/1985 | Van Dyk Soerewyn ............ 357/81 |
| 4,542,260 | 9/1985 | Pearce ............................. 174/52 PE |
| 4,546,410 | 10/1985 | Kaufman . |
| 4,546,411 | 10/1985 | Kaufman . |
| 4,554,613 | 11/1985 | Kaufman . |
| 4,574,162 | 3/1986 | Kaufman . |
| 4,577,387 | 3/1986 | Kaufman . |
| 4,630,174 | 12/1986 | Kaufman . |
| 4,642,716 | 2/1987 | Wakabayashi ..................... 360/104 |
| 4,670,771 | 6/1987 | Neidig ................................. 361/388 |

Primary Examiner—G. P. Tolin
Attorney, Agent, or Firm—Andrus, Sceales, Starke & Sawall

[57] ABSTRACT

A circuit package (2) includes a housing (10) having a chimney (20) extending downwardly through an upper epoxy coating material (16) into a lower thermally expansible soft silicon coating material (14) which covers heat generating electrical components (8) on a ceramic substrate (4). The soft silicon coating material is pliable and subject to thermal expansion. The epoxy coating material is substantially rigid and not subject to thermal expansion. The chimney provides a thermal expansion relief passage for the soft silicon coating material upon heating thereof by the electrical components, to prevent the ceramic substrate from being pushed away from the housing by the soft silicon coating material during thermal expansion thereof, and reduce undesirable forces against internal components.

6 Claims, 1 Drawing Sheet

CIRCUIT PACKAGE WITH THERMAL EXPANSION RELIEF CHIMNEY

BACKGROUND AND SUMMARY

The invention relates to compact circuit packages for electrical components, including high power applications.

A circuit package typically includes an electrically insulating thermally conductive ceramic substrate bonded on a base plate or heat sink. Lead frames and electrical components are bonded on the ceramic substrate, and a housing covers the circuit components and substrate. A first coating material, such as a soft silicon sealer, covers the circuit components in the housing, and a second coating, such as hardened epoxy, covers the soft silicon.

During current flow through the lead frames and electrical components, the soft silicon is heated and thermally expands, which may tend to push the ceramic substrate away from the housing, and apply undesirable forces against internal components. The present invention addresses and solves this problem.

DETAILED DESCRIPTION

Figure 1:
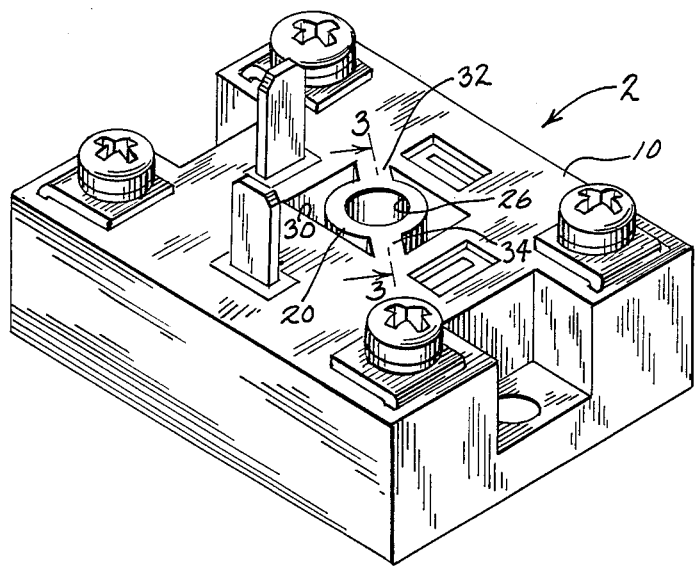
FIG. 1 is a perspective view of a circuit package in accordance with the invention.
Figure 2:
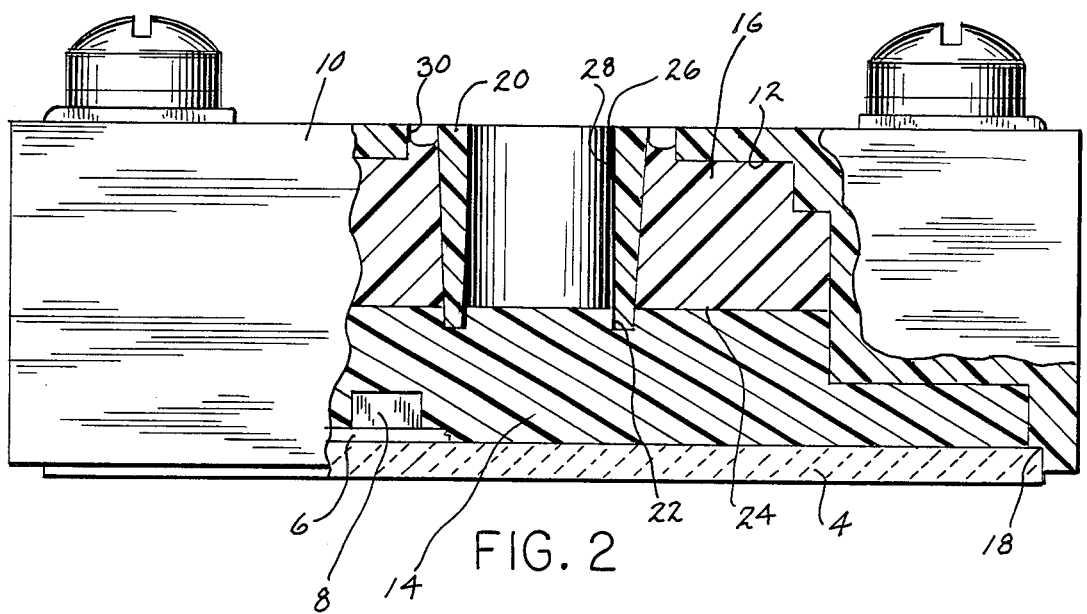
FIG. 2 is a side view of the package in FIG. 1, partially cut away.

There is shown in FIG. 1 a circuit package 2 including an electrically insulating thermally conductive substrate 4, FIG. 2, such as ceramic, mountable to a heat sink contiguously therebelow (not shown). Heat dissipating circuitry, including copper lead frames such as 6 and heat generating electrical components such as 8, for example semiconductor components, are mounted on top of substrate 4. A thermo plastic housing 10 covers substrate 4 and extends upwardly therefrom and has a downwardly opening cavity 12 over electrical components 8. Housing 10 fits snugly around the perimeter of substrate 4, and substrate 4 extends slightly below the bottom edge of housing 10. The lead frames extend along the top surface of substrate 4 and are bent at a right angle to extend upwardly through the top of housing 10. The structure thus far described is known in the art, for example as shown in U.S. Pat. Nos. 4,630,174, 4,546,410, 4,488,202, 4,449,165, 4,394,530, 4,218,724, incorporated herein by reference.

Also as known in the art, electrical components 8 are covered with an electrically insulating coating material 14, such as soft silicon, as noted in U.S. Pat. No. 4,394,530. Coating 14 is in turn covered by another electrically insulating coating material 16, such as epoxy, which substantially fills the remainder of cavity 12 and cures to a hardened condition. The soft silicon coating material 14 is pliable and remains pliable upon heating by the heat generating electrical components 8 and tends to thermally expand in response thereto. Epoxy 16 is substantially more rigid than soft silicon 14 and does not thermally expand. The heat generated by electrical components 8 is not sufficient to liquify the soft silicon coating material 14 to the point where such material can seep out along the perimeter edge interface 18 of ceramic substrate 4 and housing 10. However, electrical components 8 can generate enough heat to cause enough thermal expansion of soft silicon coating material 14 to the point where such expansion tends to push ceramic substrate 4 away from housing 10, and apply undesirable forces against the electrical components.

Figure 3:
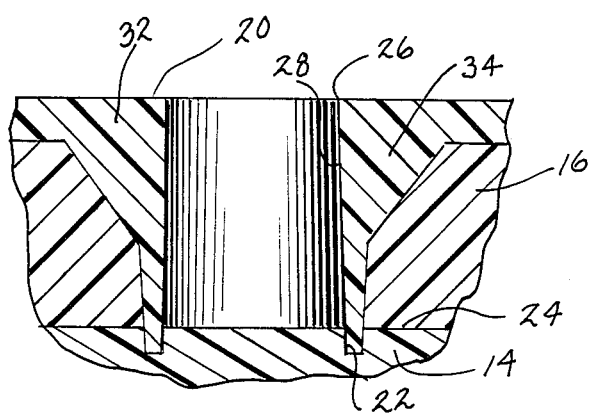
FIG. 3 is a sectional view taken along line 3—3 of FIG. 1.

In the present invention, a chimney 20 extends downwardly through the housing into communication with soft silicon coating material 14. Chimney 20 has a lower opening 22 above ceramic substrate 4 and below the interface 24 of soft silicon material 14 and epoxy 16. Chimney 20 provides a thermal expansion relief passage for soft silicon material 14 upon heating thereof, to prevent substrate 4 from being pushed away from housing 10 during thermal expansion of material 14, and reduce undesirable forces against the electrical components. Chimney 20 is a tubular member having an upper opening 26 at the top of the housing, and having an interior 28 isolated from epoxy 16. An opening 30 is provided in the top wall of the housing around chimney 20. Opening 30 is is communication with epoxy 16. A pair of radial spokes 32 and 34, FIG. 3, extend between chimney 20 and the housing, and support the chimney within opening 30. Chimney 20 extends downwardly from such spokes.

Soft silicon coating material 14 is firstly inserted through either or both of openings 26 and 30 to a level above the bottom end opening 22 of chimney 20. Epoxy 16 is then inserted into the housing through opening 30, but not opening 26. The epoxy cures to a hardened condition.

It is recognized that various equivalents, alternatives and modifications are possible within the scope of the appended claims.

I claim:

1. A circuit package comprising:
an electrically insulating thermally conductive substrate;
circuit means, including heat generating electrical components, mounted on top of said substrate;
a housing covering said substrate and extending upwardly therefrom and having a downwardly opening cavity over said electrical components;
a first electrically insulating coating material covering said electrical components in said cavity in said housing, said first coating material being pliable and remaining pliable upon heating by said heat generating electrical components, but being subject to thermal expansion;
a second electrically insulating coating material covering said first coating material in said cavity in said housing, said second coating material being more rigid than said first coating material and less subject to thermal expansion;
a chimney extending downwardly through said housing into communication with said first coating material, said chimney having a lower opening above said substrate and below the interface of said first coating material with said second material, such that said chimney provides a thermal expansion relief passage for said first coating material upon heating thereof to prevent said substrate from being pushed away from said housing by said first coating material during thermal expansion thereof, and reduce undesirable forces against said electrical components.

2. The invention according to claim 1 wherein said chimney means comprises a tube having an upper opening at a top wall of said housing and having a downwardly extending wall isolating the interior of the tube from said second coating material, and comprising an opening in said housing in communication with said second coating material.

3. The invention according to claim 2 wherein said first mentioned opening is within said second mentioned opening, and comprising means supporting said tube within said second opening.

4. The invention according to claim 3 comprising a plurality of spokes extending between said tube and said housing through said second opening, said tube depending downwardly from said spokes.

5. The invention according to claim 2 wherein said tube depends downwardly from said housing top wall and has a lower end spaced above said substrate.

6. The invention according to claim 2 comprising in ordered combination:
firstly, inserting said first coating material into said housing through either or both of said first and second mentioned openings;
secondly, inserting said second coating material into said housing through said second opening but not said first opening.

* * * * *